United States Patent [19]

Mulz

[11] Patent Number: 4,924,177

[45] Date of Patent: May 8, 1990

[54] TESTER FOR SOLID STATE ELECTRONIC COMPONENTS

[76] Inventor: Robert H. Mulz, 3927 Palm Ave., San Diego, Calif. 92154

[21] Appl. No.: 489,758

[22] Filed: Apr. 29, 1983

[51] Int. Cl.⁵ ............................................. G01R 31/02
[52] U.S. Cl. ................................. 324/133; 324/158 T
[58] Field of Search ............. 324/158 T, 133, 158 SC, 324/51, 73 R

[56] References Cited

U.S. PATENT DOCUMENTS 3,689,838  9/1972  Thurman, Jr. .................. 324/158 T

FOREIGN PATENT DOCUMENTS

| 2247113 | 3/1974 | Fed. Rep. of Germany ...... 324/158 SC |
| 1563197 | 3/1969 | France ............................ 324/158 T |
| 0119882 | 9/1979 | Japan ..................................... 29/574 |
| 612511 | 7/1979 | Switzerland ......................... 324/133 |
| 210249 | 3/1968 | U.S.S.R. ............................... 324/133 |
| 1437098 | 5/1976 | United Kingdom ................ 324/133 |

OTHER PUBLICATIONS

Radio and Electron., Penfold, R., "Square Wave Transistor Tester", Aug. 1979, vol. 32, No. 12, pp. 737-740.
Toute Electron., No author, "Controleur de Thyristors", May 1977, No. 421, p. 93.
Radio and Electronics Constructor, Lloyd, F., "Discriminating Continuity Tester", Mar. 1976, vol. 29, No. 8, pp. 504-505.
Radio-Electronics, Frye, J., "Five New Transistor Checkers", Mar. 1958, vol. 29, No. 3, pp. 47-50.
Author unknown, "Comprobator de Transistores Functiona-No Functiona", Révista Espánola De Electronica, vol. 28, No. 325, Dec. 1981, p. 27.
Production Devices, Model 85, Transistor Tester description, Dec. 1970.

Primary Examiner—Jerry Smith
Assistant Examiner—Stephen M. Baker
Attorney, Agent, or Firm—Baker, Maxham, Jester & Meador

[57] ABSTRACT

A tester for determining basic electronic and circuit information of solid state components. The tester provides indications in 2- and 3-wire devices of short or open conditions, whether a transistor is NPN or PNP type and whether or not an SCR or triac will latch. Both visual and audible indications are provided and cooperatively provide the indications of component quality.

11 Claims, 1 Drawing Sheet

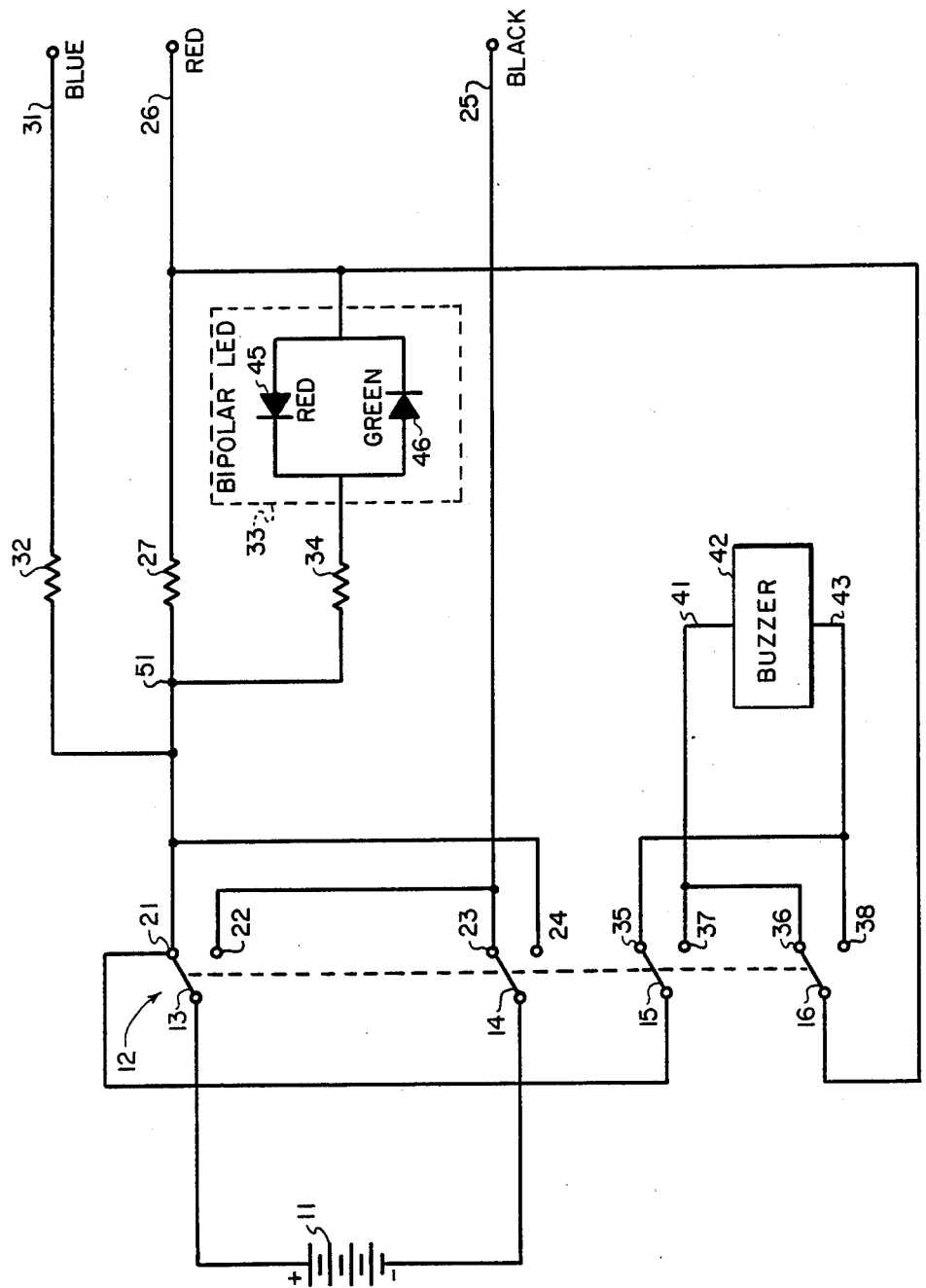

TESTER FOR SOLID STATE ELECTRONIC COMPONENTS

FIELD OF THE INVENTION

This invention relates generally to electronic testers and more particularly to a simple apparatus for determining the integrity of solid state components.

BACKGROUND OF THE INVENTION

A number of relatively complex and costly solid state electronic component testers are presently available. Some of them determine whether or not a transistor is good and also whether it is a NPN or a PNP type device. However, a tester with the ability to test a number of different components for shorts, opens or type has not been available. Further, prior art devices did not normally provide testing for fuses, silicon controlled rectifiers (SCR's) and other discrete solid state devices, particularly to determine whether an SCR would latch properly.

SUMMARY OF THE INVENTION

It is a primary object of this invention to provide a multipurpose, inexpensive, simple tester for 2- and 3-terminal solid state electronic components.

Broadly speaking, the invention concerns a battery-operated electronic circuit having a bipolar light-emitting diode (LED) and an audible signal to determine shorts, opens, and type for various discrete electronic components. Depending upon switch position, the color of LED indication and the presence or absence of the audible signal, it can be determined whether the transistor is an NPN or PNP type. The electrical integrity of various components, such as transistors, triacs, diodes, SCR's, LED's and fuses, and even simple circuit continuity, are effectively tested by this instrument in a simple manner.

BRIEF DESCRIPTION OF THE DRAWING

The objects, advantages and features of this invention will be more readily appreciated from the following detailed description when read in conjunction with the accompanying drawing comprising a single schematic diagram of the circuit of the invention.

DESCRIPTION OF THE PREFERRED EMBODIMENT

With reference now to the drawing, there is shown a battery 11 connected at either side to elements of a switch 12 having four movable contacts 13, 14, 15 and 16. Switch element 13 connected to the positive side of the battery has two functional positions contacting terminals 21 or 22. Switch 14 connected to the negative side of the battery has two positions contacting terminals 23 and 24. When switch elements 13 and 14 are in contact with terminals 21 and 23 respectively, switch 12 is in the NPN position. When the switch is moved so that contacts 13 and 14 connect with terminals 22 and 24 respectively, the switch is in PNP condition. Terminal 23 is connected to black lead 25 of the tester and terminal 21 is connected to red lead 26 through resistor 27 and to blue lead 31 through resistor 32. Bipolar LED 33, in series with resistor 34, is connected across resistor 27.

When switch 12 is moved to the alternative position, the negative side of battery 11 is connected through switch 14 and contact 24 to red and blue leads 26 and 31 respectively while switch element 13 is connected to black lead 25 through terminal 22. As stated previously, this is the PNP mode of the tester.

Switch elements 15 and 16 are shown connected to terminals 35 and 36, having alternative terminal positions 37 and 38 respectively. Terminals 36 and 37 provide alternative connections to lead 41 of audible indicator or buzzer 42, while terminals 35 and 38 are connected to lead 43 of the buzzer. Switch element 15 is connected to terminal 21 and thereby to one side of battery 11, depending upon the position of switch 12, while switch element 16 connects the other side of the buzzer to red lead 26. When switch 12 is in the NPN mode, lead 43 of buzzer 42 is connected to the positive side of the battery while lead 41 is connected to the negative side when the switch is in the PNP position. Thus lead 43 is always positive with respect to lead 41, but the buzzer is switched in its connection to LED 33 to correspond with the change in polarity at junction 51 with the respective switch positions. In the NPN mode, junction 51 is positive while it becomes negative when switch 12 is in the PNP mode.

By way of example, battery 11 may comprise a 9-volt battery, resistors 32 and 34 are typically 100 ohms while resistor 27 is a 1,000 ohm resistor. Bipolar LED 37 is shown as having red and greed diodes although it would be possible to use a different kind of device having a similar visual function. It should be noted that the circuit does not have an audio transformer apart from a coil necessary to operate buzzer 42. Of course, other audio indicators could be used in place of a buzzer.

For general operation description, when switch 12 is in the NPN position as shown in the drawing, current flow is from the minus side of battery 11 through switch element 14 to contact 23 and through the black lead to the component under test. Current returns to the circuit by means of the read and blue leads through terminal 21 and switch element 13 to the positive side of battery 11. In this condition the red side 45 of the LED is biased ON. When switch 12 is in the PNP position, which is the alternative position shown in the drawing, current flow is from the minus side of battery 11 through contact element 14 and terminal 24 through the red and blue leads to the component under test. Current returns to the circuit by means of the black lead 25 through terminal 22, switch element 13 and back to the positive side of battery 11. In this condition the green LED 46 is biased ON and glows. In both cases described above, when continuity is achieved through the component under test, the buzzer 42 will sound.

The operation of the device will be described by way of several examples dealing with several different discrete electronic components.

TRANSISTOR TEST

To test various aspects of a transistor, the steps listed below should be followed:

1. Switch 12 should be placed in the NPN position as shown in the drawing.

2. Connect the red lead to the collector of the transistor.

3. Connect the black lead to the emitter. If the buzzer sounds and the LED glows red, the transistor is shorted emitter to collector. If the buzzer does not sound and the LED glows red, there is an indication that there is leakage through the base junction. If the buzzer does not sound and the LED does not glow, continue to step 4.

4. Connect the blue lead to the base of the transistor. If the transistor is good, the buzzer will sound and the LED will glow red indicating that the transistor is of the NPN type. If no buzzer is heard and the LED does not glow, switch 12 should be changed to the PNP position. At that point the buzzer should sound and the LED should glow green indicating that the transistor is of the PNP type. If at this point there is still no buzzer sound and the LED does not glow, the transistor should be considered as being bad and should be replaced.

It is important that the red and black leads of the tester be connected to the collector and the emitter of the transistor under test before connecting the blue lead to the base.

TRIAC TEST

To test a triac, the following steps should be observed:

1. Set switch 12 to the NPN position.
2. Connect the black lead to main terminal 1 of the triac.
3. Connect the red lead to main terminal 2. At this point the buzzer should not sound and the LED should not glow.
4. Connect the blue lead to the gate of the triac. Now the buzzer should sound and the LED should glow red.
5. Remove the blue lead from the gate of the triac. If the buzzer and the LED do not continue functioning at this point, the triac should be considered as bad. If the buzzer and the LED remain on, the switch should be switched to the PNP position and this should cause the buzzer and the LED to stop functioning.
6. Connect the blue lead to the gate of the triac. At this point the buzzer should sound and the LED should glow green.
7. Remove the blue lead from the gate. The buzzer and LED should remain on until either the red or the black lead is removed from the triac terminal. If all these conditions are not met, the triac should be considered bad.

SCR TEST

For testing of an SCR, conduct the following steps:

1. Set the switch 12 to the NPN position.
2. Connect the red lead to the anode of the SCR under test.
3. Connect the black lead to the cathode of the SCR. If the SCR is good, the buzzer will not sound and the LED will not glow at this point.
4. Connect the blue lead to the gate of the SCR. Now the buzzer should sound and the LED should glow red indicating that the gate has latched the SCR ON.
5. Remove the blue lead. The buzzer should continue to sound and the LED should remain on.
6. Remove the red or black lead so that the LED and the buzzer stop functioning. If all of the above conditions are not met, the SCR should be considered bad and should be replaced.

Some SCR's may indicate bad when the red lead is connected to the anode and the black lead is connected to the cathode (a shorted condition). Should this occur, remove the black lead from the cathode and touch the black lead to the gate lead of the device under test. This should unlatch the gate of the SCR. Repeat steps 1 through 6 to determine if device is bad.

DIODE TEST

A diode may be tested as follows:

1. Set the switch 12 to the NPN position.
2. Connect the red lead of the tester to the cathode of the diode under test.
3. Connect the black lead to the anode of the diode. If the buzzer does not sound and the LED does not glow, change the position of switch 12 to the PNP position. A buzzer should sound and the LED should glow green. This indicates that the diode under test is neither shorted nor open. If the black lead is connected to the cathode and the red lead is connected to the anode, then with switch 12 in the NPN position, the LED will glow red. It should be noted that this circuit does not check forward-to-reverse bias of the diode.

LED TEST

An LED may be tested by following this procedure:

1. Switch 12 should be put in the PNP position.
2. Connect the red lead to the anode of the LED.
3. Connect the black lead to the cathode of the LED. At this point the LED under test should glow. Operation of both the audible and visible indicators of the tester indicate that the LED is good.

To test a bipolar LED, the tester should be employed as follows:

1. Set switch 12 to the NPN position.
2. Connect the red lead of the tester to the anode or the LED.
3. Connect the black lead of the tester to the cathode of the LED. The LED under test should glow red, the buzzer of the tester should sound and the tester LED should also glow red.
4. Set the switch 12 to the PNP position. At this time the LED under test should glow green, the tester buzzer should sound and the tester LED should also glow green. If these conditions are not met, the LED under test should be considered to be bad.

CONTINUITY TEST

For the following test, if the switch 12 is in the NPN position, the LED will glow red to indicate continuity.

1. Touch the red and black leads together and note the sound of the buzzer and the red glow of the tester LED.
2. Connect the red lead of the tester to one side of the circuit being tested for continuity.
3. Connect the black lead to the other side of the circuit. If there is continuity the buzzer will sound and the LED will glow either red or green depending on the position of switch 12.
4. A change in the buzzer tone as well as a dimming of the tester LED from the levels noted in step 1 above indicates that a resistance of as much as 3,000 ohms is present. If the resistance is over 3,000 ohms, the buzzer will not sound and the LED will not glow.

A fuse can also be tested for continuity, observing the fact that if the switch is in the NPN position, the tester LED will glow red.

1. Connect the red lead of the tester to one end of the fuse.
2. Connect the black lead to the opposite end of the fuse. If the fuse is good, the buzzer will sound and the LED will glow.

When this tester is employed for the tests described above, it is apparent that audible tones may be relied upon for several basic useful indications. Alternatively, the visual indicators may be relied upon, particularly where one color has different functional indications than does the other color of the visual indicator. In some instances both audible and visual indicators combine to provide the desired information.

The simplicity, versitility and economic advantage of this invention should now be readily apparent to the person skilled in the art. It is likely that modifications and improvements can be made which are within the scope of the appended claims.

What is claimed is:

1. A quality tester for electronic components, said tester selectively providing indications of simple circuit continuity and, in two- and three-terminal solid state components, of short and open conditions, transistor type, and latchability of SCR's and triacs, said tester comprising:
a DC voltage source having a positive side and a negative side;
bistable switching means connected to the positive and negative sides of said voltage source, said switching means having first and second stable positions;
a first lead selectively connected to the positive and negative sides of said voltage source;
a second lead selectively coupled to the negative and positive sides of said voltage source;
a first resistor connected between said second lead and said switching means;
a third lead connected between said first resistor and said switching means;
a second resistor connected in said third lead; and
a three-state visual indicator and diode means connected in parallel with said first resistor, said visual indicator and diode means having first and second terminals and providing selective quality indications for the component being tested;
said first and second leads being adapted to be connected to the leads of a two-lead device such as an LED, fuse, diode and two circuit leads for circuit continuity testing, the emitter and collector of a transistor, the two main terminals of a triac and the anode and cathode of a silicon controlled rectifier (SCR), to determine shorts and open circuits, said third lead being adapted to be connected to the base of the transistor, and the gate of the triac and the SCR, whereby said second resistor biases the transistor ON and latches the triac and the SCR;
said switching means and said visual indicator and diode means being adapted to distinguish NPN and PNP transistors from each other and to determine state of latching ability of SCR's and triacs in either their positive or negative state by reversing the polarity of the applied voltage of said first and second leads and to said visual indicator and diode means, said switching means further changing the voltage polarity on said first and second leads to determine shorts, opens and conductive direction through various of the electronic components to be tested.

2. The tester recited in claim 1 wherein:
when said switching means is in said first position, said first lead is connected to said negative side of said voltage source and said second lead is connected through said first resistor to said positive side of said voltage source, thereby positively biasing one terminal of said visual indicator and diode means; and when said switching means is in said second position, said first lead is connected to said positive side of said voltage, source and said second lead is connected through said first resistor to said negative side of said voltage source, thereby negatively biasing said one terminal of said visual indicator and diode means.

3. The tester recited in claim 1, and further comprising audible indicator means connected in parallel with said first resistor, said audible indicator means having first and second terminals and providing audible indications of current conduction in one of the components, said buzzer functioning simultaneously with one of said indicators of said visual indicator means.

4. The tester recited in claim 3 wherein when a diode is to be tested, non-actuation of both said indicator means with said switching means in said first position, said first lead connected to the anode of the diode and said second lead connected to the cathode of the diode, and actuation of said audible indicator means and the second state of said visual indicator and diode means indicates that the diode is not shorted or open.

5. The tester recited in claim 3 wherein when a diode is to be tested, non-actuation of both said indicator means with said switching means in said second position, said first lead connected to the cathode of the diode and said second lead connected to the anode of the diode, and actuation of said audible indicator means and the first state of said visual indicator and diode means indicates that the diode is not shorted or open.

6. The tester recited in claim 3 wherein:
said audible indicator means is connected across said first resistor through said switching means; whereby
when said switching means in in said first position, said first terminal of said audible indicator means is connected to said positive side of said voltage source and said second terminal of said audible indicator means is connected to said second lead;
when said switching means is in said second position, said first terminal of said audible indicator means is connected to said second lead and said second terminal is connected to said negative side of said voltage source.

7. The tester recited in claim 3 wherein when a transistor is to be tested, with said switching means in said first position, said first lead connected to the emitter of the transistor and said second lead connected to the collector of the transistor, actuation of said audible indicator and diode means and one state of said visual indicator means indicates shorting between emitter and collector, non-actuation of said audible indicator means and actuation of said one state of said visual indicator and diode means indicates leakage through the base junction of the transistor.

8. The tester recited in claim 7 wherein, with said third lead connected to the base of the transistor, actuation of both said audible indicator means and said one state of said visual indicator and diode means indicates that the transistor is good and that it is an NPN type device.

9. The tester recited in claim 8 wherein non-actuation of said audible indicator and diode means and said visual indicator means with said switch selectively in both said first and said second positions indicates that the transistor is bad.

10. The tester recited in claim 8 wherein non-actuation of said audible indicator and diode means and said visual indicator means with said switching means in said first position, and actuation of said audible indicator means and the second state of said visual indicator and diode means when said switching means is in said second position indicates that the transistor is good and that it is a PNP type device.

11. A method for testing electronic components with a tester capable of providing indications of simple circuit continuity and, in two- and three-terminal solid state components, of short and open conditions, transistor type, and latchability of SCR's and triacs, the tester comprising a DC voltage source having a positive side and a negative side, switching means connected to the positive negative sides of said voltage source, said switching means having first and second positions, a first lead selectively connected to the positive and negative sides of said voltage source, a second lead selectively coupled to the negative and positive sides of said voltage source, a first resistor connected between said second lead and said switching means, a third lead coupled between said first resistor and said switching means, a second resistor connected in said third lead, a three-state visual indicator and diode means connected in parallel with said first resistor, said visual indicator and diode means having first and second terminals, said method comprising the steps of:

setting said switching means to said first position;

connecting said first lead to one terminal of an electronic component to be tested;

connecting said second lead to a second terminal of said component;

observing visual indication means responses to provide information on electrical shorts within said component;

when testing a three terminal component, connecting said third lead to the third terminal of said component thereby biasing said component ON through said second resistor;

observing responses of said visual indication means to provide information as to quality of said component; and setting said switching means to said second position to determine type of component.

* * * * *